United States Patent
Yang et al.

(10) Patent No.: US 7,206,564 B2
(45) Date of Patent: Apr. 17, 2007

(54) SYSTEM AND METHOD TO PERFORM ADAPTIVE CHANNEL FILTERING ON A RADIO FREQUENCY BURST IN A CELLULAR WIRELESS NETWORK

(75) Inventors: Baoguo Yang, Iselin, NJ (US); Nelson R. Sollenberger, Farmingdale, NJ (US)

(73) Assignee: Broadcom Corporation, Irvine, CA (US)

( * ) Notice: Subject to any disclaimer, the term of this patent is extended or adjusted under 35 U.S.C. 154(b) by 494 days.

(21) Appl. No.: 10/862,714

(22) Filed: Jun. 7, 2004

(65) Prior Publication Data
US 2005/0085237 A1    Apr. 21, 2005

Related U.S. Application Data

(60) Provisional application No. 60/511,946, filed on Oct. 16, 2003.

(51) Int. Cl.
*H04B 1/10* (2006.01)

(52) U.S. Cl. .................... 455/307; 455/226.1; 455/296; 375/346

(58) Field of Classification Search ............. 455/226.1, 455/226.3, 296, 307; 325/228, 346
See application file for complete search history.

(56) References Cited

U.S. PATENT DOCUMENTS

| | | | | |
|---|---|---|---|---|
| 4,907,293 A | * | 3/1990 | Ueno | .......................... 455/295 |
| 5,339,455 A | * | 8/1994 | Vogt et al. | .................. 455/266 |
| 5,493,717 A | * | 2/1996 | Schwarz | ..................... 455/306 |
| 5,584,063 A | * | 12/1996 | Brinkhaus | .................... 455/266 |
| 5,758,296 A | * | 5/1998 | Nakamura | ............... 455/575.7 |
| 6,901,243 B2 | * | 5/2005 | Jayaraman et al. | ........ 455/63.1 |
| 6,957,054 B2 | * | 10/2005 | Li | .............................. 455/296 |
| 7,039,093 B2 | * | 5/2006 | Rouphael et al. | ........... 375/141 |

\* cited by examiner

*Primary Examiner*—Edward F. Urban
*Assistant Examiner*—Blane J. Jackson
(74) *Attorney, Agent, or Firm*—Garlick Harrison Markison; Robert McLauchlan

(57) ABSTRACT

A method to perform adaptive channel filtering on a Radio Frequency (RF) bursts in a cellular wireless communication system. This method first filters an input signal with a first stage filter having a first bandwidth to produce a first stage output signal. Then the first stage output signal is filtered with a second stage filter having a second bandwidth narrower than that of the first stage filter to produce a multi-stage output signal. A comparison between first stage performance measurements and multi-stage performance measurements determine the mode of operation of the adaptive multistage filter. A first mode of operation, selected when the first stage performance measurement compares favorably with the second stage performance measurement, selects the output of the first stage filter as the output of the multi-stage filter. Otherwise, a second mode of operation selects the output of the second stage filter as the output of the multi-stage filter.

33 Claims, 16 Drawing Sheets

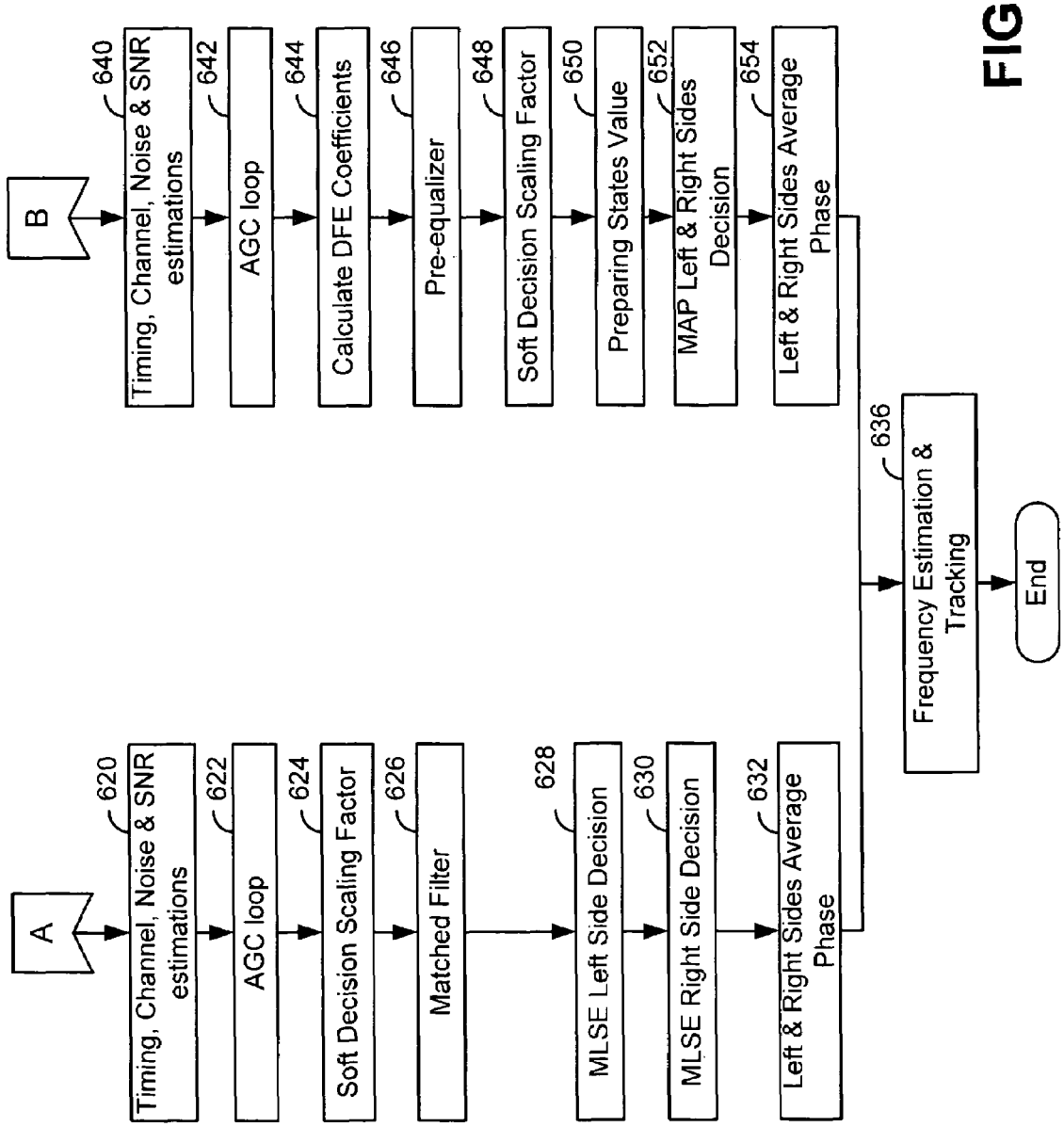

SYSTEM AND METHOD TO PERFORM ADAPTIVE CHANNEL FILTERING ON A RADIO FREQUENCY BURST IN A CELLULAR WIRELESS NETWORK

CROSS REFERENCES TO RELATED APPLICATIONS

This application claims priority to U.S. Provisional Patent Application Ser. No. 60/511,946, filed Oct. 16, 2003, which is incorporated herein by reference for all purposes.

BACKGROUND

1. Technical Field

The present invention relates generally to cellular wireless communication systems, and more particularly to a system and method to perform adaptive filtering on a radio frequency (RF) burst in a cellular wireless network.

2. Related Art

Cellular wireless communication systems support wireless communication services in many populated areas of the world. While cellular wireless communication systems were initially constructed to service voice communications, they are now called upon to support data communications as well. The demand for data communication services has exploded with the acceptance and widespread use of the Internet. While data communications have historically been serviced via wired connections, cellular wireless users now demand that their wireless units also support data communications. Many wireless subscribers now expect to be able to "surf" the Internet, access their email, and perform other data communication activities using their cellular phones, wireless personal data assistants, wirelessly linked notebook computers, and/or other wireless devices. The demand for wireless communication system data communications will only increase with time. Thus, cellular wireless communication systems are currently being created/modified to service these burgeoning data communication demands.

Cellular wireless networks include a "network infrastructure" that wirelessly communicates with wireless terminals within a respective service coverage area. The network infrastructure typically includes a plurality of base stations dispersed throughout the service coverage area, each of which supports wireless communications within a respective cell (or set of sectors). The base stations couple to base station controllers (BSCs), with each BSC serving a plurality of base stations. Each BSC couples to a mobile switching center (MSC). Each BSC also typically directly or indirectly couples to the Internet.

In operation, each base station communicates with a plurality of wireless terminals operating in its cell/sectors. A BSC coupled to the base station routes voice communications between the MSC and a serving base station. The MSC routes voice communications to another MSC or to the PSTN. Typically, BSCs route data communications between a servicing base station and a packet data network that may include or couple to the Internet. Transmissions from base stations to wireless terminals are referred to as "forward link" transmissions while transmissions from wireless terminals to base stations are referred to as "reverse link" transmissions. The volume of data transmitted on the forward link typically exceeds the volume of data transmitted on the reverse link. Such is the case because data users typically issue commands to request data from data sources, e.g., web servers, and the web servers provide the data to the wireless terminals. The great number of wireless terminals communicating with a single base station forces the need to divide the forward and reverse link transmission times amongst the various wireless terminals.

Wireless links between base stations and their serviced wireless terminals typically operate according to one (or more) of a plurality of operating standards. These operating standards define the manner in which the wireless link may be allocated, setup, serviced and torn down. One popular cellular standard is the Global System for Mobile telecommunications (GSM) standard. The GSM standard, or simply GSM, is predominant in Europe and is in use around the globe. While GSM originally serviced only voice communications, it has been modified to also service data communications. GSM General Packet Radio Service (GPRS) operations and the Enhanced Data rates for GSM (or Global) Evolution (EDGE) operations coexist with GSM by sharing the channel bandwidth, slot structure, and slot timing of the GSM standard. GPRS operations and EDGE operations may also serve as migration paths for other standards as well, e.g., IS-136 and Pacific Digital Cellular (PDC).

The GSM standard specifies communications in a time divided format (in multiple channels). The GSM standard specifies a 4.615 ms frame that includes 8 slots of, each including eight slots of approximately 577 µs in duration. Each slot corresponds to a Radio Frequency (RF) burst. A normal RF burst, used to transmit information, typically includes a left side, a midamble, and a right side. The midamble typically contains a training sequence whose exact configuration depends on modulation format used. However, other types of RF bursts are known to those skilled in the art. Each set of four bursts on the forward link carry a partial link layer data block, a full link layer data block, or multiple link layer data blocks. Also included in these four bursts is control information intended for not only the wireless terminal for which the data block is intended but for other wireless terminals as well.

GPRS and EDGE include multiple coding/puncturing schemes and multiple modulation formats, e.g., Gaussian Minimum Shift Keying (GMSK) modulation or Eight Phase Shift Keying (8PSK) modulation. Particular coding/puncturing schemes and modulation formats used at any time depend upon the quality of a servicing forward link channel, e.g., Signal-to-Noise-Ratio (SNR) or Signal-to-Interference-Ratio (SIR) of the channel, Bit Error Rate of the channel, Block Error Rate of the channel, etc. As multiple modulation formats may be used for any RF burst, wireless communication systems need the ability to determine which coding scheme and modulation format will result in the successful receipt and demodulation of the information contained within the RF burst. This decision may be further influenced by changing radio conditions and the desired quality level to be associated with the communications.

The ability to simultaneously service multiple RF communications depends on the bandwidth of individual channels and bandwidth available for the cellular system. The maximum number of channels is given by dividing bandwidth available for the cellular system by the individual channel bandwidth. For example, in a GSM system, the carrier frequencies for adjacent channels are typically separated by 200 kHz.

Major limitations within cellular systems arise from co-channel interference and adjacent channel interference. Co-channel interference arises by the spectrum allocated for the various channels being re-allocated or re-used as the wireless terminal receives the intended signal and some unintended signals as well. The problem of co-channel interference may be more or less severe depending on the amount of re-use. However, in all cases, a signal received will contain not only the desired forward channel signal from the current cell, but also signals originating in more distant cells. This problem is often addressed by optimizing the frequency assignments for various cells.

Adjacent channel interference arises from signal impairment at one frequency due to the presence of another signal on a nearby frequency. Ideally, adjacent channels do not interfere with one another. However, in reality, adjacent channel interference can severally impact the performance of the RF communications. This impairment is caused by the inability of the receiver to filter out the signals from adjacent channels or the fact that these signals may actually overlap.

One solution to adjacent channel interference applies a filter having a bandwidth that excludes those portions of the actual spectrum of the RF bursts that may be negatively impacted by adjacent channel interference. However, this tradeoff unnecessarily excludes a portion of the RF communication when no adjacent channel interference exists. Therefore, a need exists for an improved system and method to filter these RF communications that does not unnecessarily reject desired signals.

BRIEF SUMMARY OF THE INVENTION

In order to overcome the shortcomings of prior devices, the present invention provides a system and method to adaptively filter radio frequency (RF) bursts transmitted between a servicing base station and a wireless terminal within a cellular wireless communication system. One solution employs a multi-stage adaptive filter to implement an adaptive filtering algorithm that services enhanced data rate modulation format signals.

This multi-stage filter has a first stage filter, having a first bandwidth, wherein the first stage filter receives and filters an input signal to produce a first stage output signal. A second stage filter operably couples to the output of the first stage filter. The second stage filter has a second bandwidth narrower than the bandwidth of the first stage filter. The second stage filter is operable to receive and filter the output signal of the first stage filter to produce a second stage output signal. A processing module determines a first stage performance measurement, such as Signal-to-Noise-Ratio (SNR) or Signal-to-Interference-Ratio (SIR) of the channel and a similar multi-stage performance measurement associated with the second stage output signal. The first stage and multi-stage performance measurements are compared wherein the result of this comparison is used to select a mode of operation of the multi-stage filter. A first mode of operation is selected when the first stage performance measurement compares favorably with the multi-stage performance measurement. In this first mode of operation the first stage output signal is selected as the output as the multi-stage filter output. A second mode of operation, having the second stage output signal as the multi-stage filter output, is selected when the first stage performance measurement compares unfavorably with the multi-stage performance measurement.

Another embodiment provides a method to adaptively filter enhanced data rate modulation format signals within a cellular wireless communication system. This method involves first filtering an input signal with a first stage filter having a first bandwidth to produce a first stage output signal. Then the first stage output signal is filtered with a second stage filter having a second bandwidth narrower than that of the first stage filter. The second stage filter produces a multi-stage output signal. A first stage performance measurement associated with the first stage output signal and a multi-stage performance measurement associated with the second stage output signal are determined and compared. A first mode of operation to adaptively filter RF communications is selected when the first stage performance measurement compares favorably with the second stage performance measurement. This first mode of operation selects the output of the first stage filter as the output of the multi-stage filter. A second mode of operation selects the output of the second stage filter as the output of the multi-stage filter when the first stage performance measurement compares unfavorably with the multi-stage performance measurement.

Another embodiment provides a wireless terminal having a radio frequency front end, and a system processor communicatively coupled to the RF front end. The RF front end and system processor are operable to receive, filter and process RF bursts transmitted according to predefined transmission standard. These RF bursts are adaptively filtered with a multi-stage filter. This multi-stage filter further includes a first stage filter having a first bandwidth operable to produce a first stage output signal and a second stage filter having a second bandwidth narrower than that of the first stage bandwidth, wherein the second stage filter receives the first stage output signal as its input to produce a second stage output signal. The RF front end and system processor further evaluate stage performance measurements associated with the first stage output signal and the second stage output signal. Comparing these performance measurements allows the system processor and RF front end to select a first or second mode of operation of the adaptive multi-stage filter. A first mode is selected when the first stage output signal has a performance measurement that compares favorably with the second stage performance measurement. The second mode of operation is selected when the first stage output signal has a performance measurement that compares unfavorably with the multi-stage performance measurement. The RF front end and system processor are further operable to form a data block from the filtered RF burst and decode the data block.

Other features and advantages of the present invention will become apparent from the following detailed description of the invention made with reference to the accompanying drawings.

BRIEF DESCRIPTION OF THE DRAWINGS

FIGS. 6A and 6B are flow charts illustrating operation of a wireless terminal in receiving and processing a RF burst.

DETAILED DESCRIPTION OF THE DRAWINGS

Figure 1:
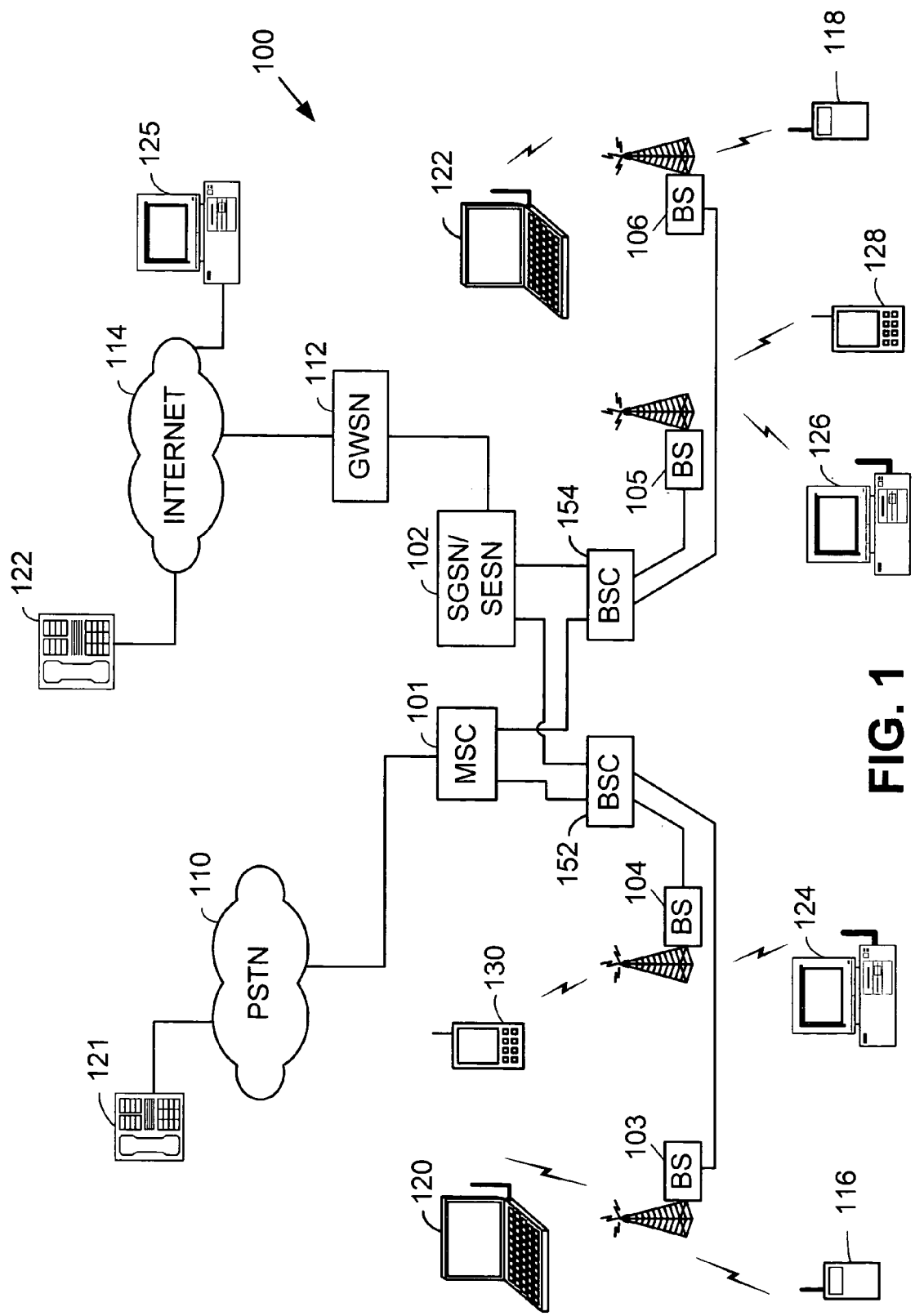
FIG. 1 is a system diagram illustrating a portion of a cellular wireless communication system that supports wireless terminals operating according to the present invention.

FIG. 1 is a system diagram illustrating a portion of a cellular wireless communication system 100 that supports wireless terminals operating according to the present invention. The cellular wireless communication system 100 includes a Mobile Switching Center (MSC) 101, Serving GPRS Support Node/Serving EDGE Support Node (SGSN/SESN) 102, base station controllers (BSCs) 152 and 154, and base stations 103, 104, 105, and 106. The SGSN/SESN 102 couples to the Internet 114 via a GPRS Gateway Support Node (GGSN) 112. A conventional voice terminal 121 couples to the PSTN 110. A Voice over Internet Protocol (VoIP) terminal 123 and a personal computer 125 couple to the Internet 114. The MSC 101 couples to the Public Switched Telephone Network (PSTN) 110.

Each of the base stations 103–106 services a cell/set of sectors within which it supports wireless communications. Wireless links that include both forward link components and reverse link components support wireless communications between the base stations and their serviced wireless terminals. These wireless links support digital data communications, VoIP communications, and other digital multimedia communications. The cellular wireless communication system 100 may also be backward compatible in supporting analog operations as well. The cellular wireless communication system 100 supports the Global System for Mobile telecommunications (GSM) standard and also the Enhanced Data rates for GSM (or Global) Evolution (EDGE) extension thereof. The cellular wireless communication system 100 may also support the GSM General Packet Radio Service (GPRS) extension to GSM. However, the present invention is also applicable to other standards as well, e.g., TDMA standards, CDMA standards, etc.

Wireless terminals 116, 118, 120, 122, 124, 126, 128, and 130 couple to the cellular wireless communication system 100 via wireless links with the base stations 103–106. As illustrated, wireless terminals may include cellular telephones 116 and 118, laptop computers 120 and 122, desktop computers 124 and 126, and data terminals 128 and 130. However, the cellular wireless communication system 100 supports communications with other types of wireless terminals as well. As is generally known, devices such as laptop computers 120 and 122, desktop computers 124 and 126, data terminals 128 and 130, and cellular telephones 116 and 118, are enabled to "surf" the Internet 114, transmit and receive data communications such as email, transmit and receive files, and to perform other data operations. Many of these data operations have significant download data-rate requirements while the upload data-rate requirements are not as severe. Some or all of the wireless terminals 116–130 are therefore enabled to support the GPRS and/or EDGE operating standard as well as supporting the voice servicing portions the GSM standard.

In particular, the wireless terminals 116–130 support the pipelined processing of received RF bursts in slots of a GSM frame so that a plurality of slots in each sub-frame of a GSM frame are allocated for forward link transmissions to a single wireless terminal. In one particular embodiment, a number of slots of a GSM frame are allocated for forward link transmissions to a wireless terminal such that the wireless terminal must receive and process a number of RF bursts, e.g., 2, 3, 4, or more RF bursts, in each sub-frame of the GSM frame. The wireless terminal is able to process the RF bursts contained in these slots and still service reverse link transmissions and the other processing requirements of the wireless terminal.

Figure 2:
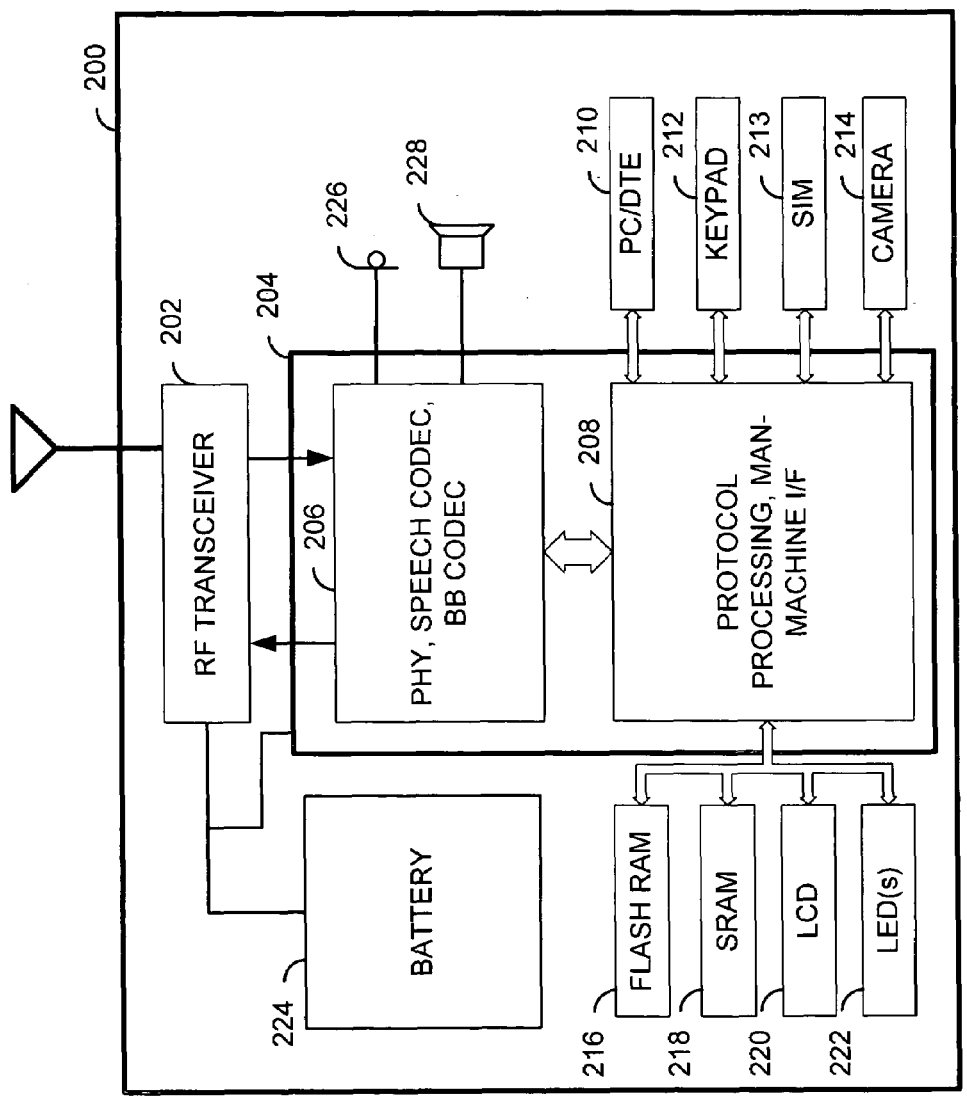
FIG. 2 is a block diagram functionally illustrating a wireless terminal constructed according to the present invention.

FIG. 2 is a block diagram functionally illustrating a wireless terminal 200 constructed according to the present invention. The wireless terminal 200 of FIG. 2 includes an RF transceiver 202, digital processing components 204, and various other components contained within a housing. The digital processing components 204 includes two main functional components, a physical layer processing, speech COder/DECoder (CODEC), and baseband CODEC functional block 206 and a protocol processing, man-machine interface functional block 208. A Digital Signal Processor (DSP) is the major component of the physical layer processing, speech COder/DECoder (CODEC), and baseband CODEC functional block 206 while a microprocessor, e.g., Reduced Instruction Set Computing (RISC) processor, is the major component of the protocol processing, man-machine interface functional block 208. The DSP may also be referred to as a Radio Interface Processor (RIP) while the RISC processor may be referred to as a system processor. However, these naming conventions are not to be taken as limiting the functions of these components.

The RF transceiver 202 couples to an antenna 203, to the digital processing components 204, and also to a battery 224 that powers all components of the wireless terminal 200. The physical layer processing, speech COder/DECoder (CODEC), and baseband CODEC functional block 206 couples to the protocol processing, man-machine interface functional block 208 and to a coupled microphone 226 and speaker 228. The protocol processing, man-machine interface functional block 208 couples to a Personal Computing/Data Terminal Equipment interface 210, a keypad 212, a Subscriber Identification Module (SIM) port 213, a camera 214, a flash RAM 216, an SRAM 218, a LCD 220, and LED(s) 222. The camera 214 and LCD 220 may support either/both still pictures and moving pictures. Thus, the wireless terminal 200 of FIG. 2 supports video services as well as audio services via the cellular network.

Figure 3:
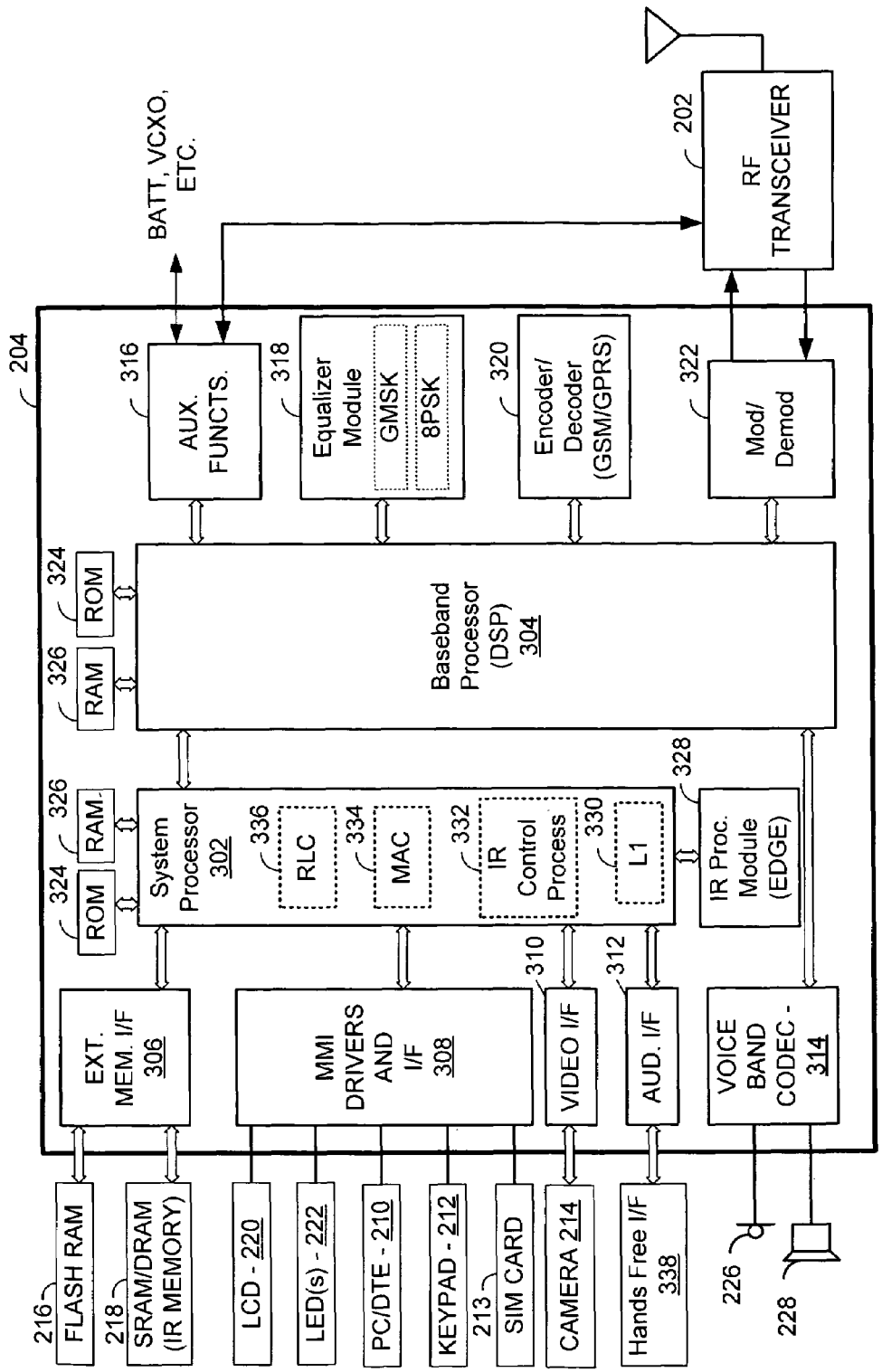
FIG. 3 is a block diagram illustrating in more detail the wireless terminal of FIG. 2, with particular emphasis on the digital processing components of the wireless terminal.

FIG. 3 is a block diagram illustrating in more detail the wireless terminal of FIG. 2, with particular emphasis on the digital processing components of the wireless terminal. The digital processing components 204 include a system processor 302, a baseband processor 304, and a plurality of supporting components. The supporting components include an external memory interface 306, MMI drivers and I/F 308, a video I/F 310, an audio I/F 312, a voice band CODEC 314, auxiliary functions 316, a modulator/demodulator 322, ROM 324, RAM 326 and a plurality of processing modules. In some embodiments, the modulator/demodulator 322 is not a separate structural component with these functions being performed internal to the baseband processor 304.

The processing modules are also referred to herein as accelerators, co-processors, processing modules, or otherwise, and include auxiliary functions 316, an equalizer module 318, an enCOder/DECoder (CODEC) processing module 320, and an Incremental Redundancy (IR) processing module 328. The interconnections of FIG. 3 are one example of a manner in which these components may be interconnected. Other embodiments support additional/alternate couplings. Such coupling may be direct, indirect, and/or may be via one or more intermediary components.

RAM and ROM service both the system processor 302 and the baseband processor 304. Both the system processor 302 and the baseband processor 304 may couple to shared RAM 326 and ROM 324, couple to separate RAM, coupled to separate ROM, couple to multiple RAM blocks, some shared, some not shared, or may be served in a differing manner by the memory. In one particular embodiment, the system processor 302 and the baseband processor 304 coupled to respective separate RAMs and ROMs and also couple to a shared RAM that services control and data transfers between the devices. The processing modules 316, 318, 320, 322, and 328 may coupled as illustrated in FIG. 3 but may also coupled in other manners in differing embodiments.

The system processor 302 services at least a portion of a serviced protocol stack, e.g., GSM/GPRS/EDGE protocol stack. In particular the system processor 302 services Layer 1 (LI) operations 330, a portion of Incremental Redundancy (IR) GSM protocol stack operations 332 (referred to as "IR control process"), Medium Access Control (MAC) operations 334, and Radio Link Control (RLC) operations 336. The baseband processor 304 in combination with the modulator/demodulator 322, RF transceiver, equalizer module 318, and/or encoder/decoder module 320 service the Physical Layer (PHY) operations performed by the digital processing components 204. The baseband processor 304 may also services a portion of the GSM/GPRS/EDGE protocol stack.

Still referring to FIG. 3, the baseband processor 304 controls the interaction of the baseband processor 304 and equalizer module 318. As will be described further with reference to FIGS. 5–6B, the baseband processor 304 is responsible for causing the equalizer module 318 and the CODEC processing module 320 to process received RF bursts that reside within slots of a GSM frame. In the particular embodiment of FIGS. 2 and 3, with single RF front end. 202, wireless terminal 200 may receive and process RF bursts in up to four slots of each sub-frame of a GSM frame, i.e., be assigned four slots for forward link transmissions in any particular GSM frame. In another embodiment in which the wireless terminal 200 includes more than one RF front end, the wireless terminal 200 may be assigned more than four slots in each sub-frame of the GSM frame. In this case, required transmit operations would be performed using a second RF front end while a first RF front end would perform the receive operations. When the forward link transmissions and the reverse link transmissions occupy different channels with sufficient frequency separation, and the wireless terminal otherwise supports full duplex operations, the wireless terminal could receive and transmit at the same time.

The combination of the RF front end 202, and base band processor 204, which may include an optional CODEC processing module, receive and adaptively filter RF communications from the servicing base station. In one embodiment the RF front end 202 and base band processor 204 receive and process RF bursts from servicing base stations. The combination of RF front end 202 and base band processor 204 are operable to receive RF bursts transmitted according to a transmission scheme wherein the transmission scheme includes both a modulation format and a coding format. These RF bursts are adaptively filtered with a multi-stage filter. This multi-stage filter further includes both a first stage filter having a first bandwidth operable to produce a first stage output signal and a second stage filter having a second bandwidth narrower than that of the first stage bandwidth, wherein the second stage filter receives the first stage output signal as its input to produce a second stage output signal.

The RF front end and baseband processor further evaluate stage performance measurements associated with the first stage output signal and the second stage output signal. These stage performance measurements may take the form of a Signal-to-Noise-Ratio (SNR) or Signal-to-Interference-Ratio (SIR) of the channel, Bit Error Rate of the channel, Block Error Rate of the channel, etc. Comparing these performance measurements allows the baseband processor and RF front end to adaptively select a first or second mode of operation for the adaptive multi-stage filter. A first mode is selected when the first stage output signal has a performance measurement that compares favorably with the second stage performance measurement. The second mode of operation is selected when the first stage output signal has a performance measurement that compares unfavorably with the multi-stage performance measurement. The RF front end and system processor are further operable to form a data block from the filtered RF burst and decode the data block.

Base band processor 204 decodes sequences of soft decisions, extracted from the RF bursts to produce a data block. The sequence of soft decisions may decode successfully into the data block as indicated by error correction coding results. These soft decisions may be protected by cyclical redundant coding (CRC) such as fire coding and convolutional coding. The combination determines whether the decoding of the data block was successful and uses this information to help determined the reported BEP for the data block. Re-encoding of properly decoded data blocks produces a sequence of re-encoded decisions which when compared to the sequence of soft decisions produces a Re-encoded Bit Error (RBER). The BEP reported to the servicing base station is based upon the estimated BEP derived from the SNR and the RBER. When the decoding is unsuccessful, the BEP may be based upon more heavily or solely the estimated BEP provided by the SNR. Similarly, when the decoding is successful, the BEP may be based upon more heavily or solely the RBER or BLER. The BLER is often considered as giving a more objective quality measurement than the BEP or RBER. These values may also be used as a performance measurement upon which the mode of operation of the adaptive filter may be selected.

Figure 4:
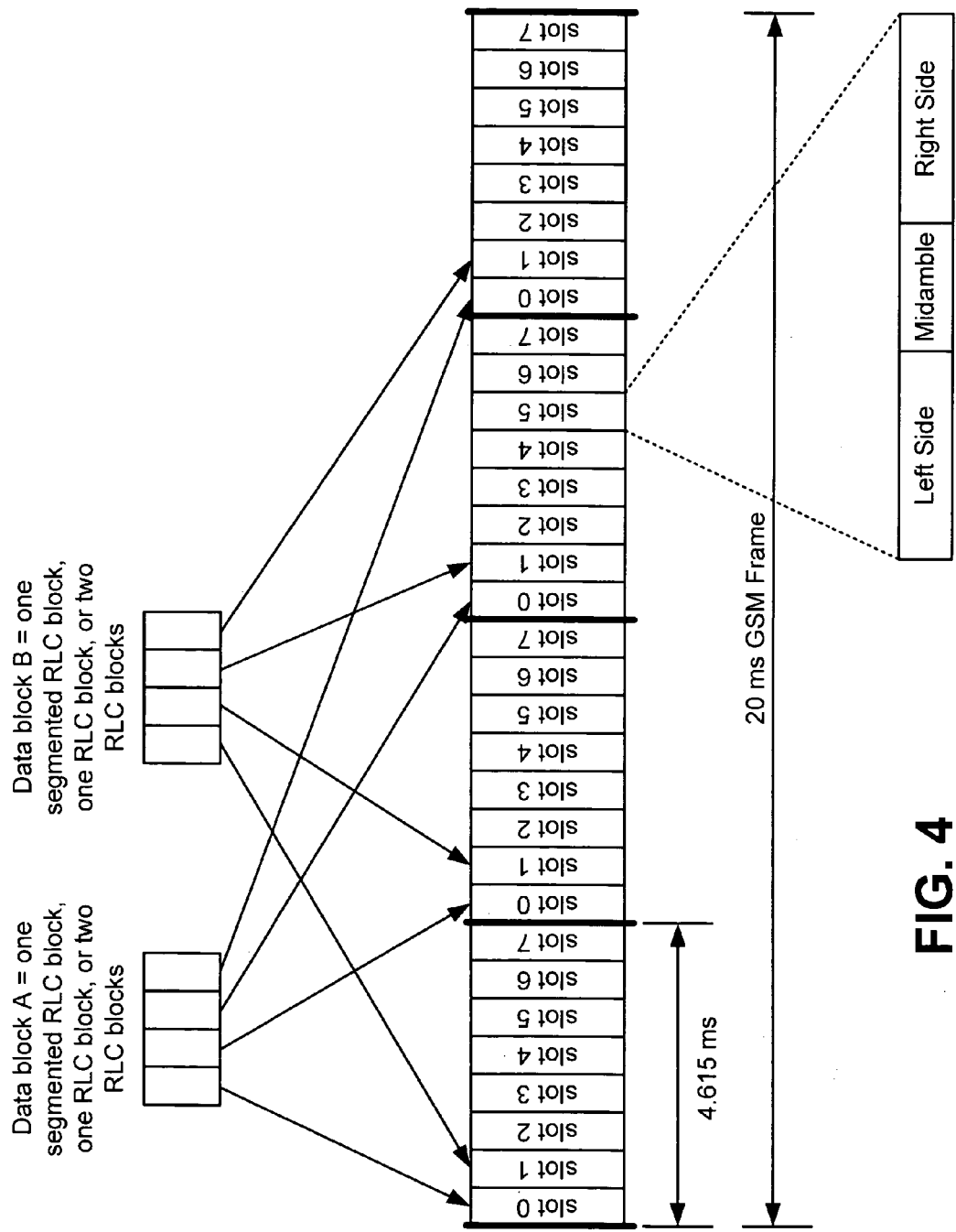
FIG. 4 is a block diagram illustrating the general structure of a GSM frame and the manner in which data blocks are carried by the GSM frame.

FIG. 4 is a block diagram illustrating the general structure of a GSM frame and the manner in which data blocks are carried by the GSM frame. The GSM frame is 4.615 ms in duration, including guard periods, and each of which includes eight slots, slots 0 through 7. Each slot is approximately 577 μs in duration, includes a left side, a midamble, and a right side. The left side and right side of an RF burst of the time slot carry data while the midamble is a training sequence.

The RF bursts of four time slots of the GPRS block carry a segmented RLC block, a complete RLC block, or two RLC blocks, depending upon a supported Modulation and Coding Scheme (MCS) mode. For example, data block A is carried in slot 0 of sub-frame 1, slot 0 of sub-frame 2, slot 0 of sub-frame 3, and slot 0 of sub-frame 3. Data block A may carry a segmented RLC block, an RLC block, or two RLC blocks. Likewise, data block B is carried in slot 1 of sub-frame 1, slot 1 of sub-frame 2, slot 1 of sub-frame 3, and slot 1 of sub-frame 3. The MCS mode or CS mode of each set of slots, i.e., slot n of each sub-frame, for the GSM frame is consistent for the GSM frame. Further, the MCS mode or CS mode of differing sets of slots of the GSM frame, e.g., slot 0 of each sub-frame vs. any of slots 1–7 of each sub-frame, may differ. This ability allows LA to be implemented. As will be described further with reference to FIG. 5, the wireless terminal 200 may be assigned multiple slots for forward link transmissions that must be received and processed by the wireless terminal 200.

Figure 5:
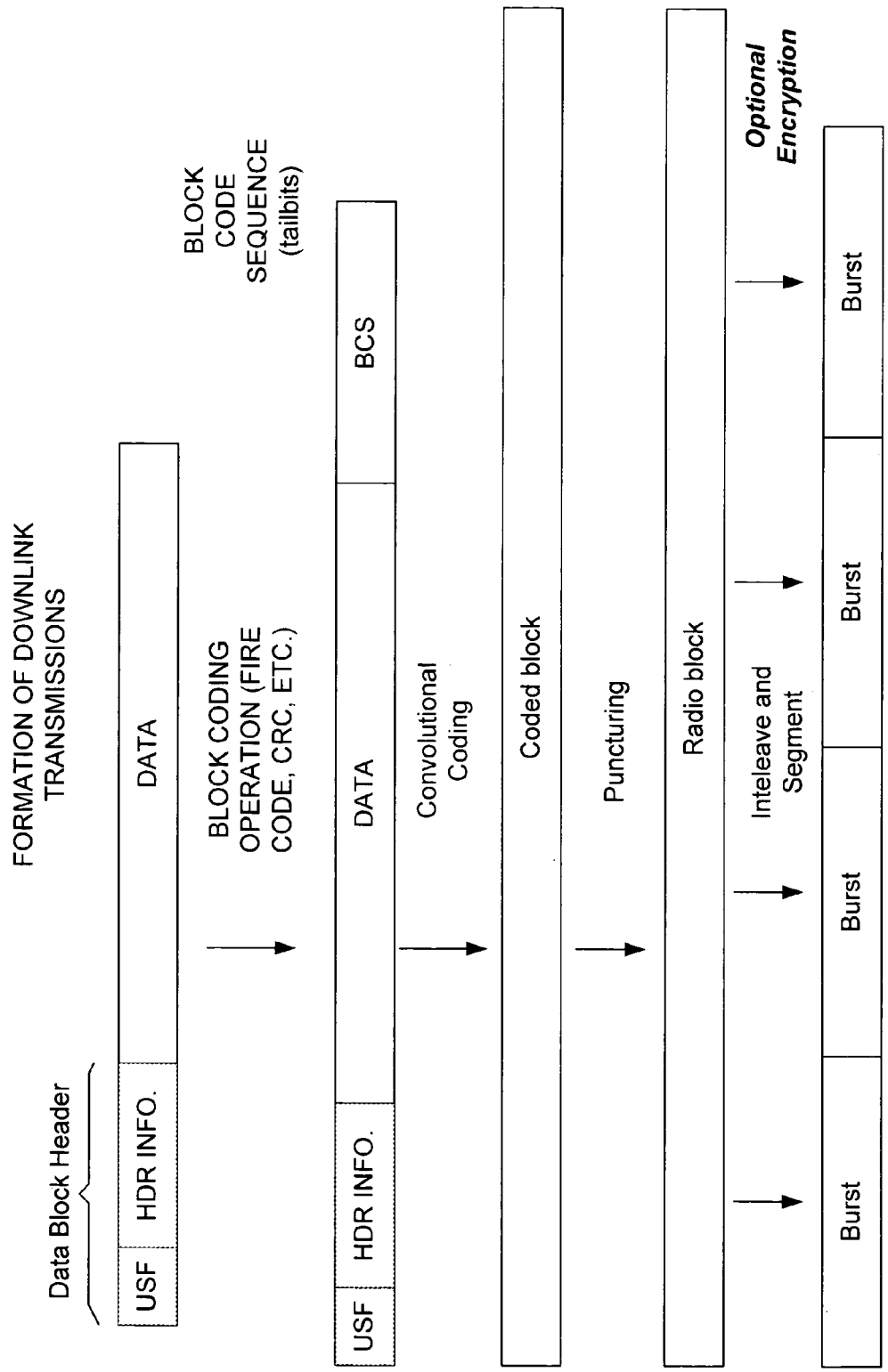
FIG. 5 is a block diagram illustrating the formation of down link transmissions.

FIG. 5 depicts the various stages associated with mapping data into RF bursts. A Data Block Header and Data are initially unencoded. The block coding operations perform the outer coding for the data block and support error detection/correction for data block. The outer coding operations typically employ a cyclic redundancy check (CRC) or a Fire Code. The outer coding operations are illustrated to add tail bits and/or a Block Code Sequence (BCS), which is/are appended to the Data. After block coding has supplemented the Data with redundancy bits for error detection, calculation of additional redundancy for error correction to correct the transmissions caused by the radio channels. The internal error correction or coding scheme of GSM is based on convolutional codes.

Some redundant bits generated by the convolutional encoder are punctured prior to transmission. Puncturing increases the rate of the convolutional code and reduces the redundancy per data block transmitted. Puncturing additionally lowers the bandwidth requirements such that the convolutional encoded signal fits into the available channel bit stream. The convolutional encoded punctured bits are passed to an interleaver, which shuffles various bit streams and segments the interleaved bit streams into the 4 bursts shown.

Each RF burst has a left side, a midamble, and a right side. The left side and right side contain data. The midamble consists of predefined, known bit patterns, the training sequences, which are used for channel estimation to optimize reception with an equalizer and for synchronization. With the help of these training sequences, the equalizer eliminates or reduces the intersymbol interferences, which can be caused by propagation time differences of multipath propagation. A number of training sequences are defined for normal RF bursts in the GSM standard. However, the exact configuration of the training sequences may depend on the modulation format used. Each set of four bursts typically utilizes the same modulation format. By analyzing the training sequence one can determine the modulation format. Different methods of determining the modulation format from the training sequence will be described in FIGS. 6A through 10.

Figure 6A:
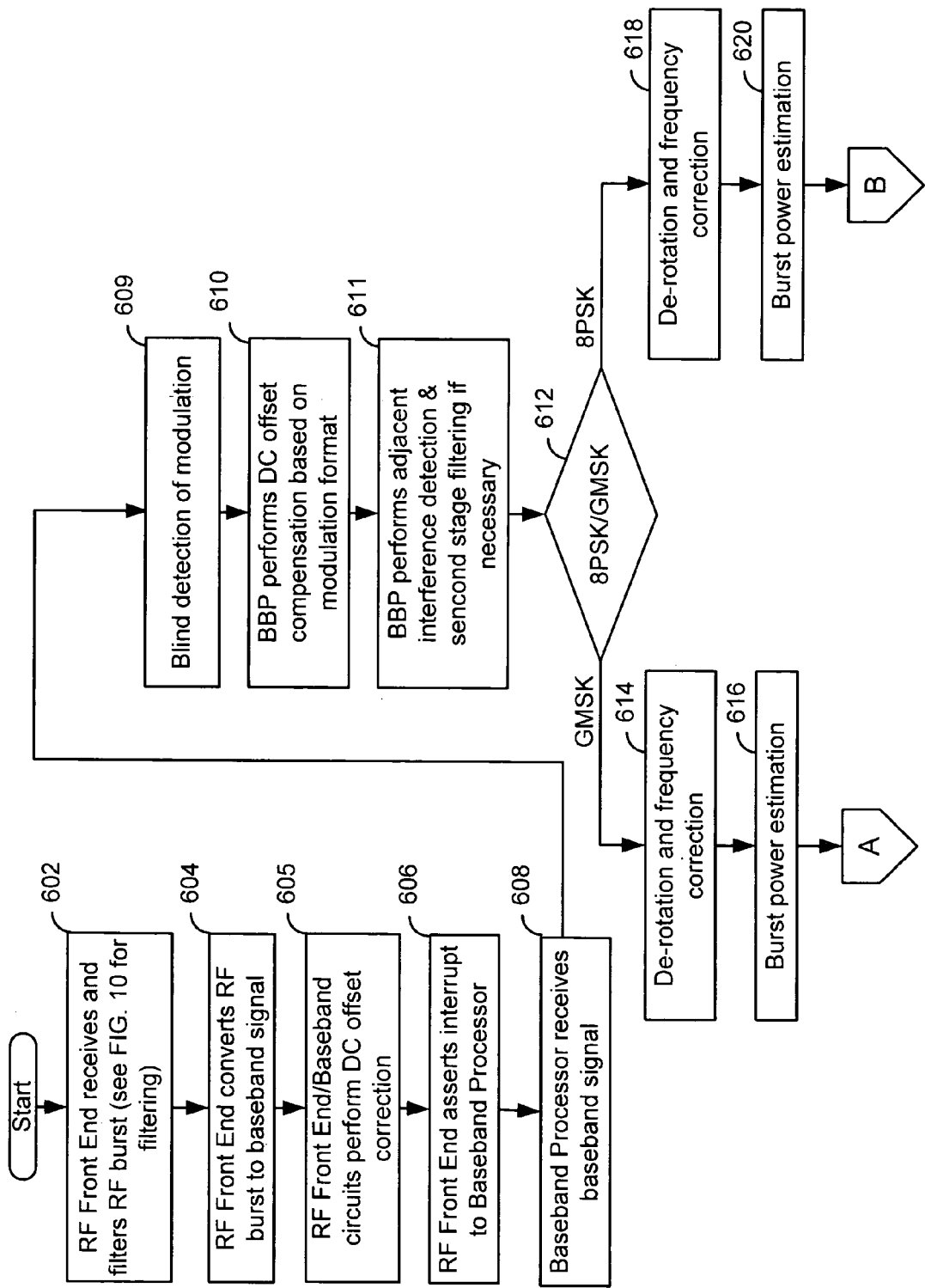

FIGS. 6A and 6B are flow charts illustrating operation of a wireless terminal 200 in receiving and processing a RF burst. The operations illustrated in FIGS. 6A to 6B correspond to a single RF burst in a corresponding slot of GSM frame. The RF front end 202, the baseband processor 304, and the equalizer module 318 illustrated in FIG. 3 perform these operations. These operations are generally called out as being performed by one of these components. However, the split of processing duties among these various components may differ without departing from the scope of the present invention.

A single processing device or a plurality of processing devices operably coupled to memory performs the processing duties. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing duties are implemented via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

Referring particularly to FIG. 6A, operation commences with the RF front end 202 receiving and filtering an RF burst in a corresponding slot of a GSM frame (step 602). One potential filtering process will be described in further detail in reference to FIG. 10. The RF front end 202 then converts the RF burst to a baseband signal (step 604). Filtering may occur prior to converting the signal to a baseband signal at an intermediate frequency. RF front end 202 or baseband circuits performs DC offset compensation on all incoming RF signals in step 605. When the RF front end uses a direct conversion receiver architecture, or the SNR is low, the RF front end 202 may not perform DC offset compensation well. In these instances, the baseband processor 304 may assist in the DC offset compensation as shown in step 610. Upon completion of the conversion, the RF front end 202 sends an interrupt to the baseband processor 304 (step 606). Thus, as referred to in FIG. 6A, the RF front end 202 performs steps 602-606.

Operation continues with the baseband processor 304 receiving the baseband signal (step 608). In a typical operation, either the RF front end 202, the baseband processor 304, or modulator/demodulator 322 will sample the analog baseband signal to digitize the baseband signal. After receipt of the baseband signal (in a digitized format), the baseband processor 304 detects the modulation format of the baseband signal (step 609). This blind detection of the modulation format determines the modulation format of the corresponding baseband signal. Various processes may be used to determine the modulation format and are known to those skilled in the art. In one particular embodiment according to the GSM standard, the modulation format will be either Gaussian Minimum Shift Keying (GMSK) modulation or Eight Phase Shift Keying (8PSK) modulation. The baseband processor 304 makes the determination and proceeds along one of two branches based upon the detected modulation format.

The baseband processor 304 performs additional DC offset compensation in step 610 based on the identified modulation format. GMSK is more robust for DC offset than 8PSK. A simple average method over one burst may work well for GMSK modulation, but such a method may cause significant decision errors for 8PSK. Moreover, the DC offset can change significantly from one RF burst to another, so the average over multi-bursts may not work well for 8PSK. 8PSK requires a more complex DC compensation method. In order to address this need, an adaptive multi-step DC offset estimation and compensation is employed.

Operation continues with the baseband processor 304 doing adaptive multi stage filtering process in step 611. One potential embodiment of the adaptive multi-stage filtering process will be described in further detail with reference to FIGS. 8–10.

For GMSK modulation, the baseband processor 304 performs de-rotation and frequency correction of the baseband signal (step 614). Next, the baseband processor 304 performs burst power estimation of the baseband signal (step 616). Referring now to FIG. 6B via off page connector A, the baseband processor 304 next performs timing, channel, noise, and signal-to-noise ratio (SNR) estimation (step 620). Subsequently, the baseband processor 304 performs automatic gain control (AGC) loop calculations (step 622). Next, the baseband processor 304 performs soft decision scaling factor determination on the baseband signal (step 624). After step 624, the baseband processor 304 performs matched filtering operations on the baseband signal (step 626).

Steps 608–626 are referred to hereinafter as pre-equalization processing operations. With the baseband processor 304 performing these pre-equalization processing operations on the baseband signal, baseband processor 304 produces a processed baseband signal. Upon completion of these pre-equalization processing operations, the baseband processor 304 issues a command to the equalizer module 318.

The equalizer module 318, upon receiving the command, prepares to equalize the processed baseband signal based upon the modulation format, e.g., GMSK modulation or 8PSK modulation. The equalizer module 318 receives the processed baseband signal, settings, and/or parameters from the baseband processor 304 and performs Maximum Likelihood Sequence Estimation (MLSE) equalization on the left side of the baseband signal (step 628). As was shown previously with reference to FIG. 4, each RF burst contains a left side of data, a midamble, and a right side of data. The midamble includes predefined training sequence that may be based on the modulation format. At step 628, the equalizer module 318 equalizes the left side of the RF burst to produce soft decisions for the left side. Then, the equalizer module 318 equalizes the right side of the processed baseband signal (step 630). The equalization of the right side produces a plurality of soft decisions corresponding to the right side.

The equalizer module 318 then issues an interrupt to the baseband processor 304 indicating that the equalizer operations are complete for the RF burst. The baseband processor 304 then receives the soft decisions from the equalizer module 318. Next, the baseband processor 304 determines an average phase of the left and right sides based upon the soft decisions received from the equalizer module 318 (step 632). The baseband processor 304 then performs frequency estimation and tracking based upon the soft decisions received from the equalizer module 318 (step 636). The operations of step 632 (or step 654) and step 636 are referred to herein as "post-equalization processing." After operation at step 636, processing of the particular RF burst is completed.

Referring again to FIG. 6A, the baseband processor 304 and equalizer module 318 take the right branch from step 612 when an 8PSK modulation is blindly detected at step 610. In the first operation for 8PSK modulation, the baseband processor 304 performs de-rotation and frequency correction on the baseband signal (step 618). The baseband processor 304 then performs burst power estimation of the baseband signal (step 620). Referring now to FIG. 6B via off page connector B, operation continues with the baseband processor 304 performing timing, channel, noise, and SNR estimations (step 640). The baseband processor 304 then performs AGC loop calculations on the baseband signal (step 642). Next, the baseband processor 304 calculates Decision Feedback Equalizer (DFE) coefficients that will be used by the equalizer module 318 (step 644). The baseband processor 304 then performs pre-equalizer operations on the baseband signal (step 646). Finally, the baseband processor 304 determines soft decision scaling factors for the baseband signal (step 648). Steps 618–648 performed by the baseband processor 304 are referred to herein as "pre-equalization processing" operations for an 8PSK modulation baseband signal. Upon completion of step 648, the baseband processor 304 issues a command to equalizer module 318 to equalize the processed baseband signal.

Upon receipt of the command from the baseband processor 304, the equalizer module 318 receives the processed baseband signal, settings, and/or parameters from the baseband processor 304 and commences equalization of the processed baseband signal. The equalizer module 318 first prepares state values that it will use in equalizing the 8PSK modulated processed baseband signal (step 650). In the illustrated embodiment the equalizer module 318 uses a Maximum A posteriori Probability (MAP) equalizer. The equalizer module 318 then equalizes the left and right sides of the processed baseband signal using the MAP equalizer to produce soft decisions for the processed baseband signal (step 652). Upon completion of step 654, the equalizer module 318 issues an interrupt to the baseband processor 304 indicating its completion of equalizing the processed baseband signal corresponding.

The baseband processor 304 then receives the soft decisions from the equalizer module 318. Next, the baseband processor 304 determines the average phase of the left and right sides of the processed baseband signal based upon the soft decisions (step 654). Finally, the baseband processor 304 performs frequency estimation and tracking for the receiver. (Step 636) The operations of steps 654 and 636 are referred to as post-equalization processing operations. From step 636, operation is complete for the particular RF burst depicts the various stages associated with recovering a data block from an RF Burst.

While the operations of FIGS. 6A and 6B are indicated to be performed by particular components of the wireless terminal, such segmentation of operations could be performed by differing components. For example, the equalization operations could be performed by the baseband processor 304 or system processor 302 in other embodiments. Further, the baseband processor 304 or the system processor 302 in other embodiments could also perform decoding operations.

Figure 7:
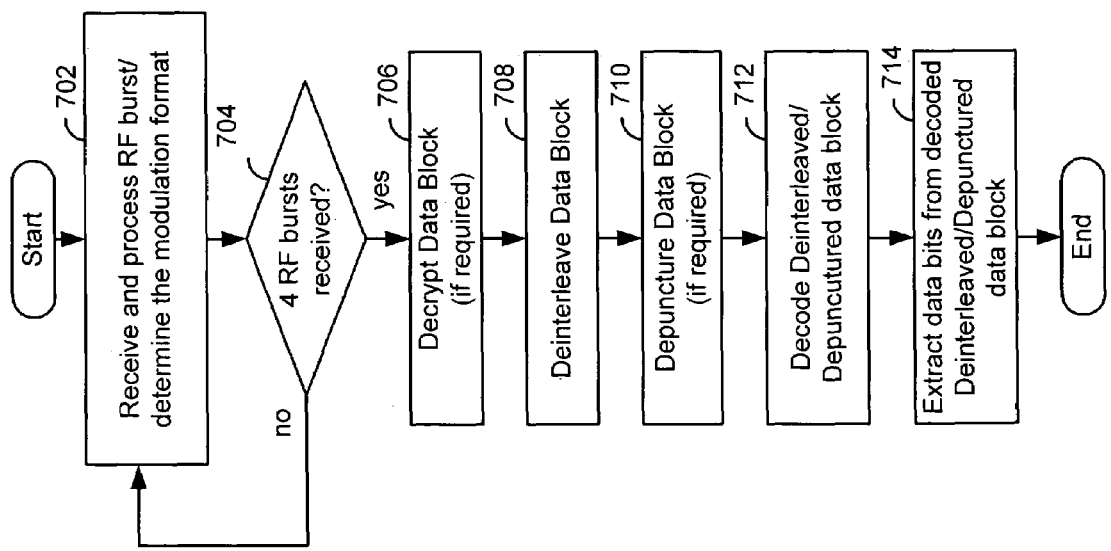
FIG. 7 is a flow chart illustrating operations to recover a data block according to an embodiment of the present invention.

FIG. 7 is a flow chart illustrating operations to decode a data block according to an embodiment of the present invention. Operations commence with receiving and processing RF burst(s) in step 702 and as described with reference to FIGS. 6A and 6B. This includes determining the modulation format in order to properly demodulate the RF burst(s). After receiving the four RF bursts that complete an EDGE or GPRS data block, as determined at step 704, operation proceeds to step 706.

A header of the data block identifies the coding scheme and puncturing pattern of the data block. For example, the coding scheme may be any one of the MCS-1 through MCS-9 coding schemes, each of which may include multiple puncturing patterns. Operation according to the present invention uses the training sequence of each RF burst, located within the midamble of the RF burst, to identify the modulation format of the RF burst.

Data recovery begins in step 706 where, if necessary, the data block is decrypted. The data block is then de-interleaved (step 708) according to a particular format of the data block, e.g. MCS-1 through MCS-9. The data block is then de-punctured (step 710). At step 712, the de-interleaved and de-punctured data block is decoded. Decoding operations may include combining previously received copies of the data block with the current copy of the data block. Data bits of the decoded data block are then extracted and processed further (step 714).

Figure 8:
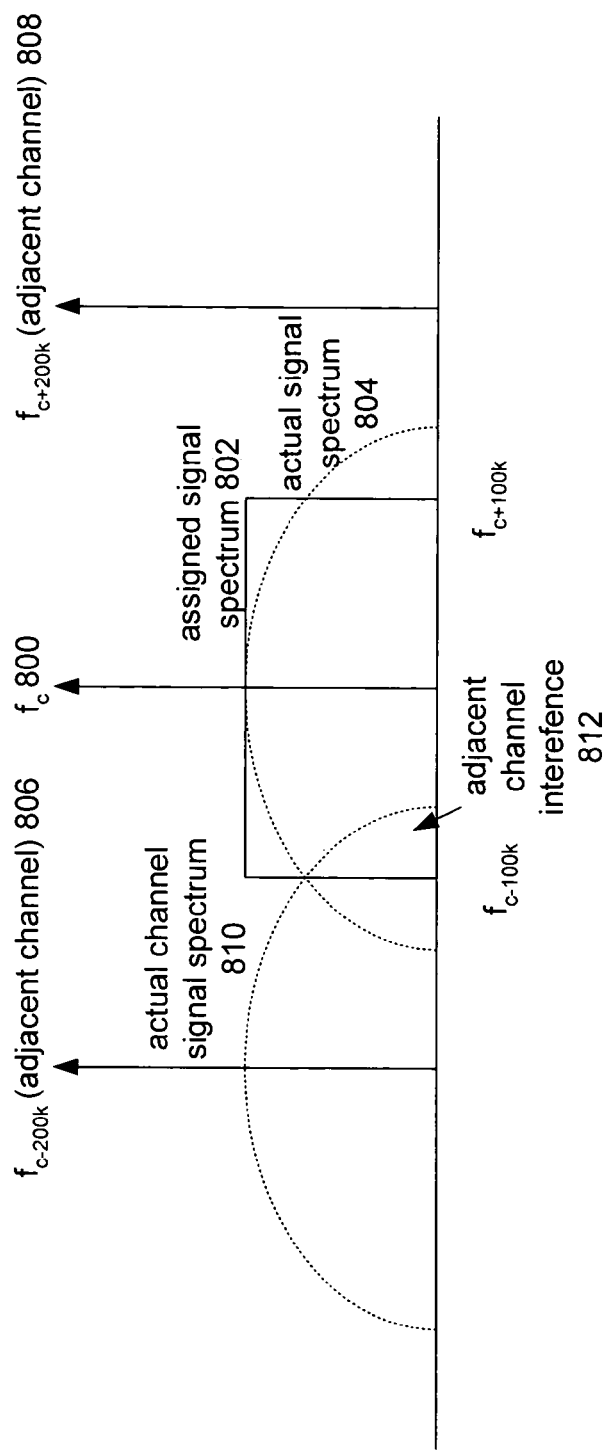
FIG. 8 illustrates the phenomena of adjacent channel interference.

FIG. 8 illustrates the need for an adaptive filtering algorithm. An adaptive filter, of which one potential embodiment will be discussed in further in FIG. 9, may take different forms. For example, the receiver filter may be an analog or a digital filter and may operate at the base band, or at an intermediate frequency. Within EDGE, carriers are placed regularly within the licensed edge spectrum as having a separation between channels of 200 kHz. A first channel is shown have a center frequency $f_c$ 800. This first channel has two adjacent channels located at $f_{c-200\ kHz}$ 806 and $f_{c+200\ kHz}$ 808. Although the assigned signal spectrum 802 associated with the first channel does not extend beyond the 200 kHz bandwidth, the actual signal spectrum 804 associated with the first channel does extend beyond these boundaries. These boundaries are shown as at $f_{c-100\ kHz}$ and $f_{c+100\ kHz}$. The actual signal spectrum 810 associated with adjacent channel 806 extends past the lower boundary $f_{c-100\ kHz}$ and upper boundary $f_{c+100\ kHz}$. The area under both the actual adjacent channel signal spectrum 810 and signal spectrum 804 is adjacent channel interference 812. Adjacent channel interference is associated with adjacent channel 806. However, no adjacent channel signal is associated with adjacent channel 808 as no signal is present in this second adjacent channel.

Actual signal spectrum 804 typically extends beyond the ideal boundaries of assigned signal spectrum 802. Due to this non-ideal situation, a filter having a bandwidth greater than that of the desired signal spectrum is desirable to retain as much as possible of the desired signal. However, when a wider receiver filter is employed, the signal becomes more susceptible to adjacent channel interference, such as that indicated by adjacent channel interference 812. One prior solution discarded those portions of the desired signal with a filter narrower that the assigned signal spectrum at the expense of sensitivity to the desired signal. An embodiment of the present invention employs an adaptive multi-stage filter, such as the one described in FIG. 9 to overcome this limitation.

Figure 9:
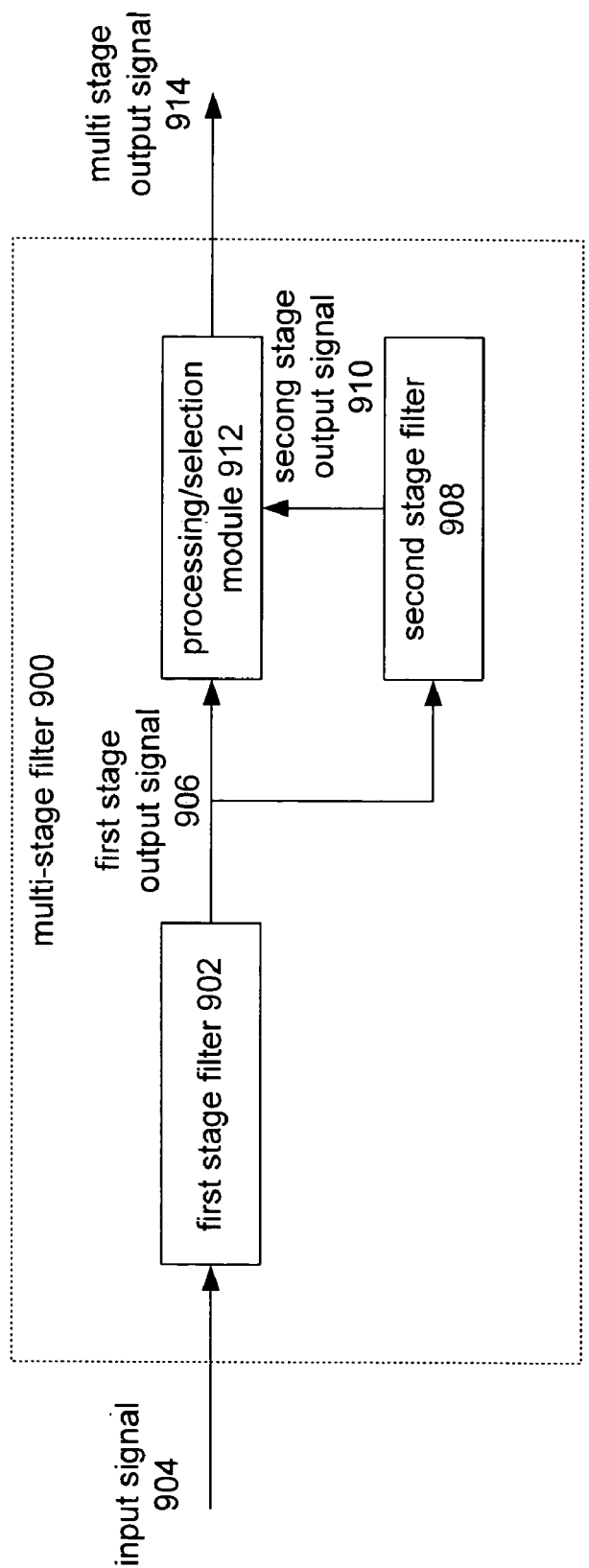
FIGS. 9 is a block diagram of one embodiment of an adaptive multi-stage filter in accordance with the present invention.

FIG. 9 depicts a multi stage filter 900 that employs two receive filters for differing co-channel or adjacent channel interference conditions. Multi-stage filter 900 receives an input signal 904, which is first processed with first stage filter 902. First stage filter 902 produces a first stage output signal 906. The bandwidth of first stage filter may be greater than that of the ideal signal spectrum in order to capture as much as possible of the desired signal. However, the far edges of this signal may be adversely impacted by adjacent channel interference when present. First stage output signal 906 serves as the input to second stage filter 908 which produces a second stage output signal 910. The bandwidth of second stage filter may be narrower than that of the first stage bandwidth and/or the ideal signal spectrum in order to reduce the negative impacts of adjacent channel interference.

Both the first stage output signal 906 and second stage output signal 910 are received by a processing/selection module 912 which selects one of these signals to be multi-stage output signal 914. When the processing/selection module 912 detects no negative impacts from adjacent channel interference, the multi-stage filter may, by default, only employ the wider bandwidth filter of the first stage. Otherwise, processing/selection module 912 applies both the wider bandwidth filter of first stage filter 902 and an additional narrower bandwidth filter of second stage filter 908 to decrease the negative impact of adjacent channel interference.

Processing/selection module 912 may employ a simple algorithm based on a performance measurement, such as but not limited to SIR or SNR, to detect the effects of adjacent channel interference. For example, one embodiment evaluates the difference between $SIR_n$ and $SIR_w$, when this difference exceeds a predetermined threshold value, adjacent channel interference conditions may be assumed to exist. In such a case the output of second stage filter 908 is selected as the multi-stage output signal.

Multi-stage filter 900 may employ a wide FIR filter as first stage filter 902 by default. This filter may be implemented in ASIC. In one embodiment first stage filter 902 has a 24× over-sampling rate and 288 taps. The second stage filter may be selected as a narrower FIR filter and implemented in with a digital signal processor (DSP). Due to the limitation of DSP computational power, second stage filter 908 may be required to be more simple than first stage filter 902. For example in a DSP burst buffer, the Rx sample is only one sample per symbol. Therefore the over-sampling rate of the second stage DSP filter is limited to 1×. Multi-stage filter 900 may also require that first stage filter 902 perform well in co-channel interference sensitivity conditions while the composite or concatenated filters perform well in an adjacent channel interference condition.

Figure 10:
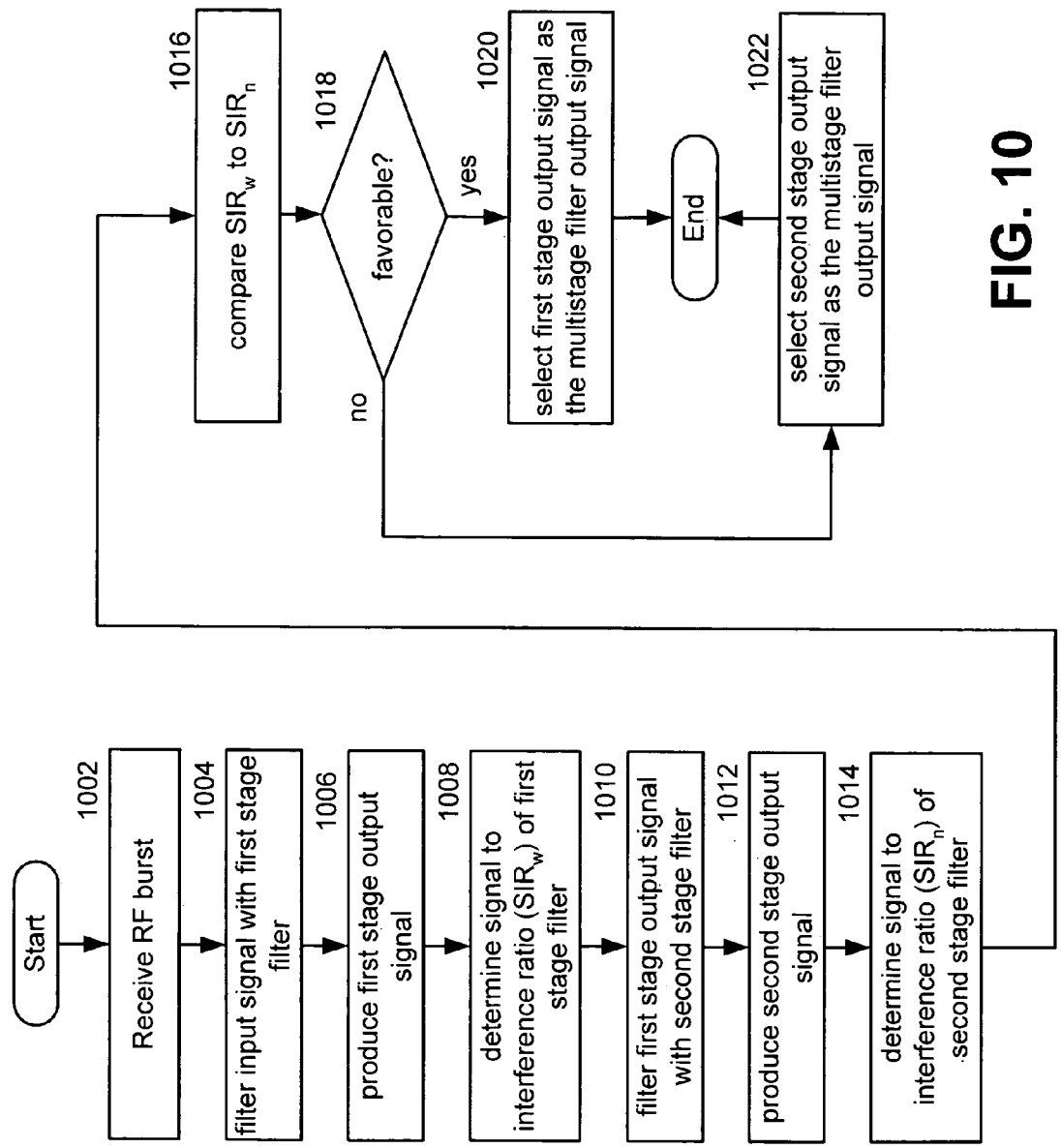
FIG. 10 is a logic diagram illustrating a method for operating a wireless terminal to determine a adaptively filter a received RF burst according to the present invention.

FIG. 10 illustrates one method of adaptively filtering received RF communications. The RF communications are received in step 1002. These RF communications may be reduced to an intermediate frequency or a base band frequency prior to filtering. However, in either case, the intermediate frequency or the base band frequency may serve as an input signal to an adaptive multi-stage filter such as the one presented in FIG. 9. The first stage filter of the adaptive multi-stage filter acts on the input signal in step 1004 to produce a first stage output signal in step 1006. Additionally, a performance measurement associated with the first stage filter, such as $SIR_w$ is determined in step 1008. SIR is chosen to illustrate one possible performance measure while other like performance measures known to those skilled in the art may be employed.

This first stage filter output signal is provided as an input to a second stage filter in step 1010. The second stage filter produces a second stage output signal in step 1012. Additionally, a performance measurement associated with the second stage filter, such as $SIR_n$ is determined in step 1014. At step 1016, a comparison of the performance measures associated with the first and second stage filter is made. In the embodiment shown, step 1016 determines the difference between $SIR_n$ and $SIR_w$. The results of this evaluation are used at decision point 1018.

An SNR estimate or other like performance measure may be used in place of the SIR. The SNR estimate may be based on the training sequence and will be negatively impacted by the presence of adjacent channel interference. Therefore, this second embodiment simply calculates or determines the SNR estimation twice. First, SNR is determined based on the wider range first stage filter, then in the second determination employs a multi-stage filtering methodology. When the difference between the two SNR estimates exceeds a threshold value, there is a strong indication of adjacent channel interference. The threshold value may be established such that if the difference between the SNR of the wide and narrow-range filters does not exceed a predetermined threshold, there is no need to employ the narrow-range filter. The effectiveness of the second-stage or narrow-range filter is reduced for small adjacent channel interference. There exists a point where using the second-stage filter does not improve receipt of performance in an adjacent channel interference condition. Thus it is possible to empirically determine this threshold value which must be exceeded prior to necessitating the actual employment of the second stage filter.

When the $SIR_w$ and $SIR_n$ compare favorably, indicating the lack of adjacent channel interference, the first stage output signal may be selected as the multistage filter output, as shown in step 1020. However, when the $SIR_w$ and $SIR_n$ compared unfavorably, indicating the presence of adjacent channel interference, the second stage output signal may be selected as the multistage filter output, as shown in step 1022.

Figure 11:
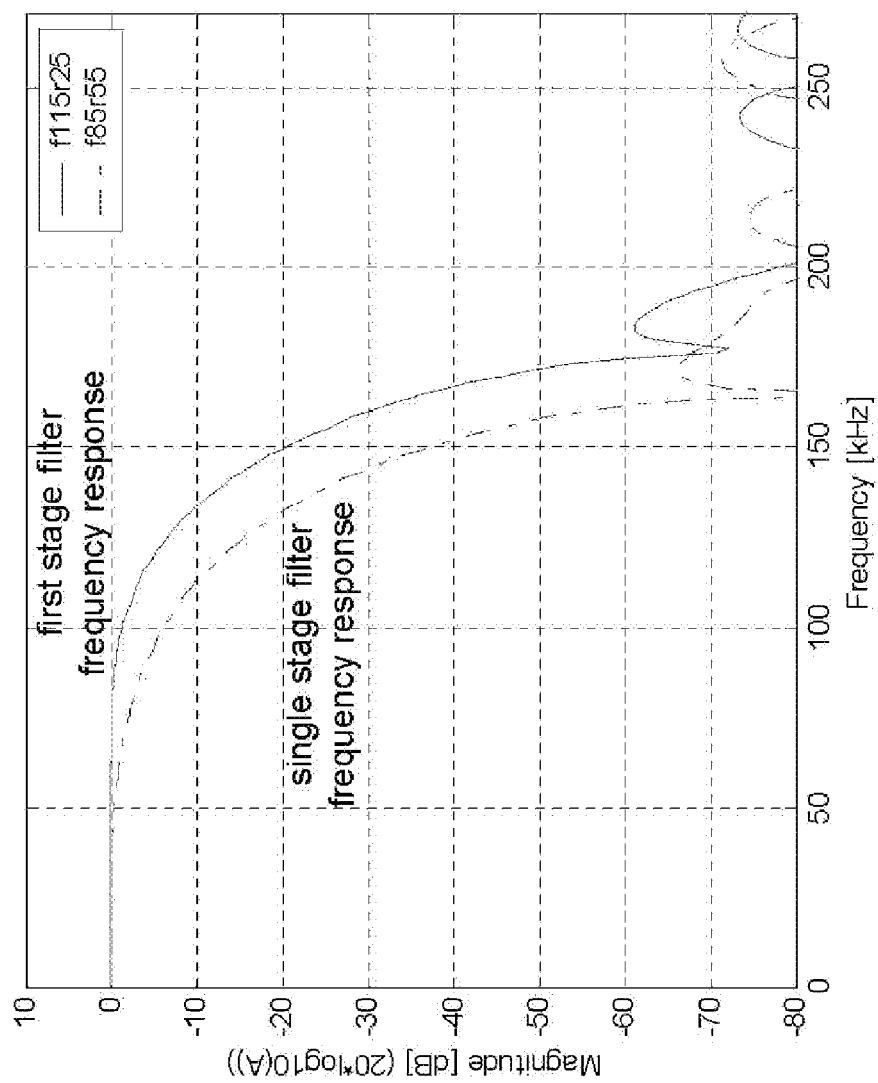
FIG. 11 graphically compares the frequency response of a single stage filter and a first stage filter of an adaptive multi-stage filter.
Figure 12:
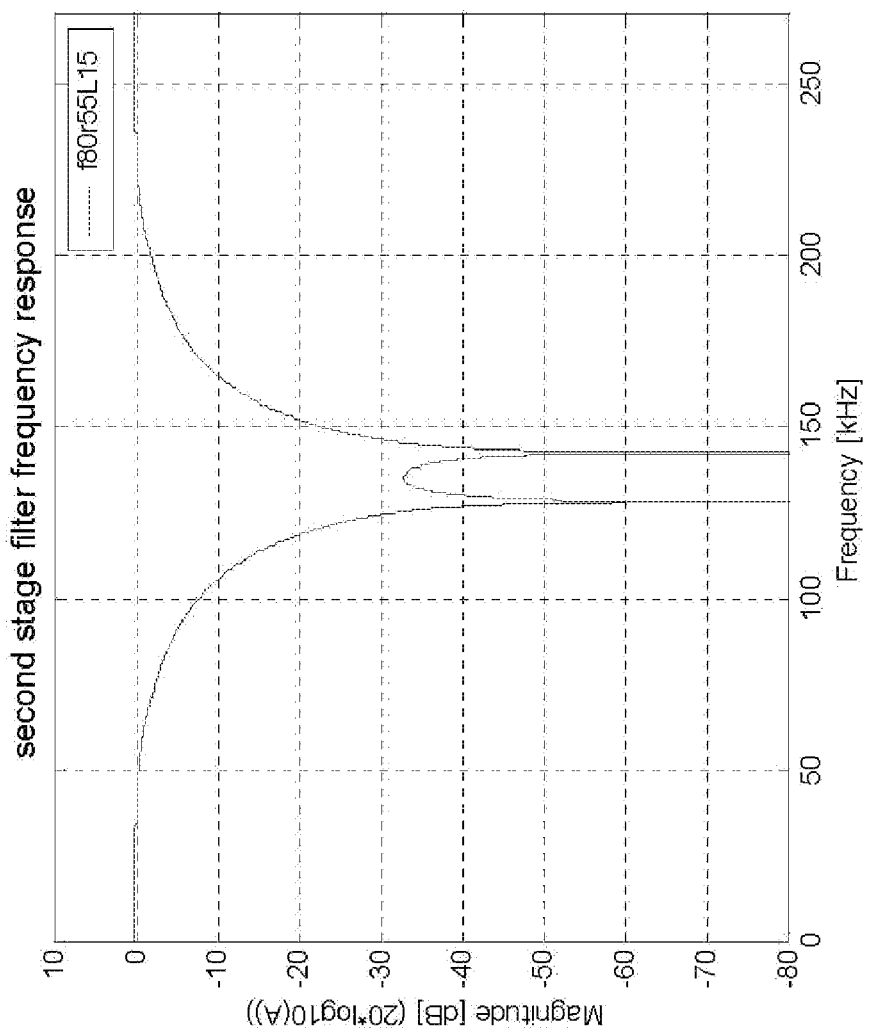
FIG. 12 depicts the frequency response of a second stage filter.

One previous solution utilized a single-stage filter having a bandwidth of approximately 85 kHz and a roll-off factor of 0.55. This filter provided a balanced performance in co-channel and adjacent channel interference conditions. This filter has a bandwidth less than that of the separation between adjacent carriers, thus, most of the signal was kept. However, a portion of the signal most sensitive to adjacent interferer was not. A wider receiver filter would improve signal sensitivity when an adjacent interferer is not present. Thus to provide balance performance with a multi-stage filter, one embodiment employs a wider bandwidth first stage RRC filter such as a 115 kHz filter having a roll-off factor of 0.25 and employs a second-stage filter as an RRC filter with a bandwidth of 80 kHz and a roll-off factor of 0.55. FIGS. 11 and 12 show the frequency response of the 115 kHz filter, 85 kHz filter and 80 kHz filter respectively.

FIG. 11 graphically illustrates represents the frequency response of a wide-range (first stage) filter having a frequency bandwidth of 115 kHz and a roll-off of 0.25 as compared to a single-stage filter having a frequency bandwidth of 85 kHz and a roll-off of 55 kHz as described above. FIG. 11 clearly shows the improved sensitivity provided with the wide range filter for the signal of interest. FIG. 12 shows the frequency response of one potential second-stage filter having a frequency bandwidth of 80 kHz and a roll-off of 0.55.

Figure 13:
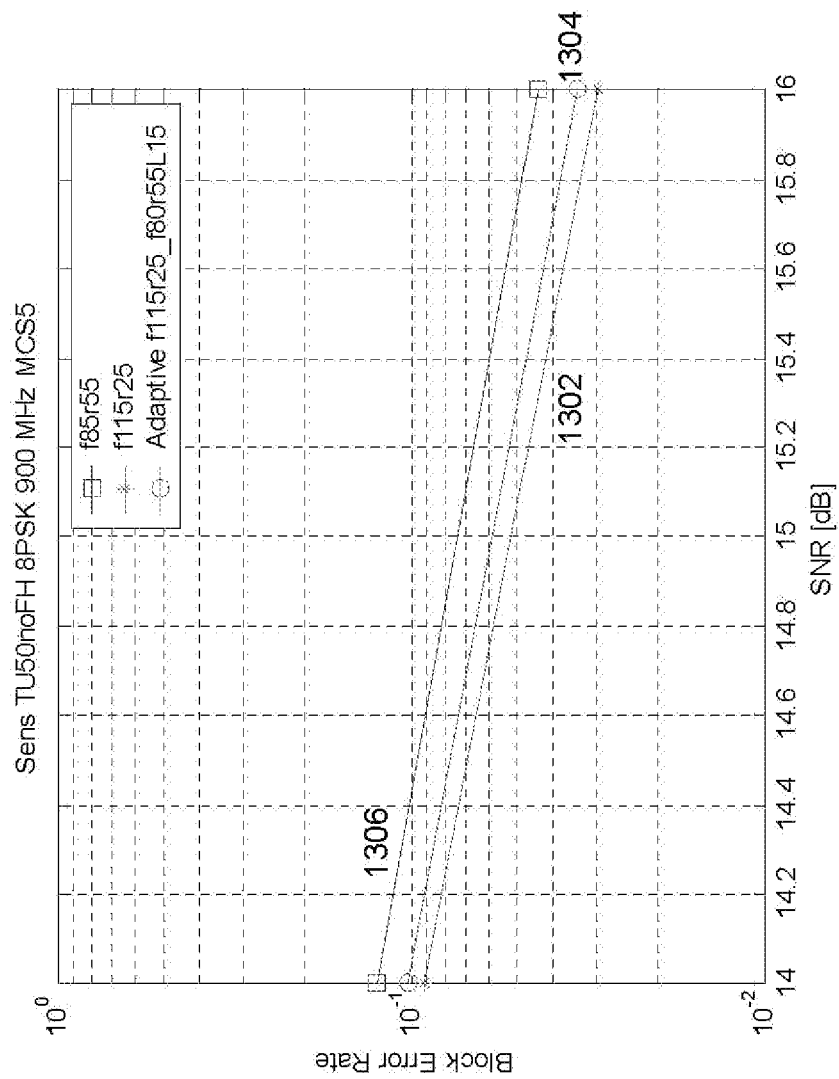
FIG. 13 graphically compares the sensitivity performance of single stage filter to that of an adaptive multi-stage filter.

FIG. 13 provides one example of the sensitivity performance when operating in the MCS 5 mode. Curve 1302 employs only a first-stage filter of 115 kHz bandwidth and a roll-off of 0.25. The performance measure used in this instance is the BLER. Curve 1304 employs adaptive multi-stage filter. The first-stage filter is a 115 kHz bandwidth and a roll-off of 0.25 and second-stage filter is an 80 kHz bandwidth and roll-off of 0.55. The usage of the second stage filter or not depends the adaptive filter selection of module 912. The prior art solution represented by curve 1306 employs a single stage filter with a frequency bandwidth of 85 kHz and a roll-off of 0.55. These curves clearly show that in the absence of adjacent channel interference employing only the first-stage filter with a 115 kHz bandwidth yields a reduced BLER and provides enhanced sensitivity. Additionally, the adaptive multi-stage filter yields improved results over the single stage prior art solution. The performance of adaptive filter selection approaches that of the ideal filter selection.

Figure 14:
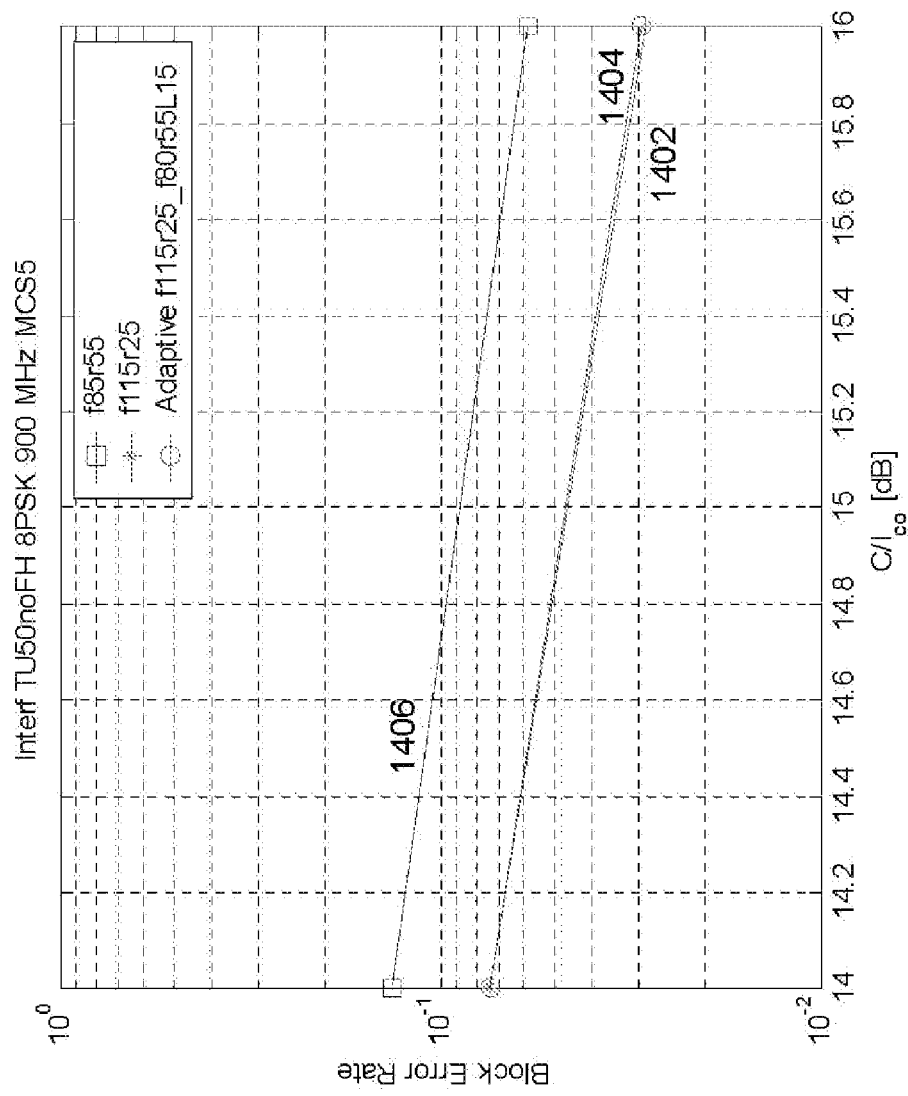
FIG. 14 graphically compares a co-channel interference performance measure of a single stage filter to that of an adaptive multi-stage filter.

FIG. 14 illustrates co-channel interference performance when operating in the MCS 5 mode. Curve 1402 employs only a first-stage filter of 115 kHz bandwidth and a roll-off of 0.25. The performance measure used in this instance is the BLER. Curve 1404 employs adaptive multi-stage filter. The first-stage filter is a 115 kHz bandwidth and a roll-off of 0.25 and second-stage filter is an 80 kHz bandwidth and roll-off of 0.55. The usage of the second stage filter or not depends on the adaptive filter selection controlled by processing/selection module 912. The prior art solution represented by curve 1406 employs a single stage filter with a frequency bandwidth of 85 kHz and a roll-off of 0.55. These curves clearly show that in the absence of adjacent channel interference employing only the first-stage filter with a 115 kHz bandwidth yields a reduced BLER and provides enhanced co-channel performance. Additionally, the adaptively combined first stage filter and second stage filter yield almost identical results as the more narrow second stage filter is disabled by adaptive filter selection module 912 most time in co-channel interference condition.

Figure 15:
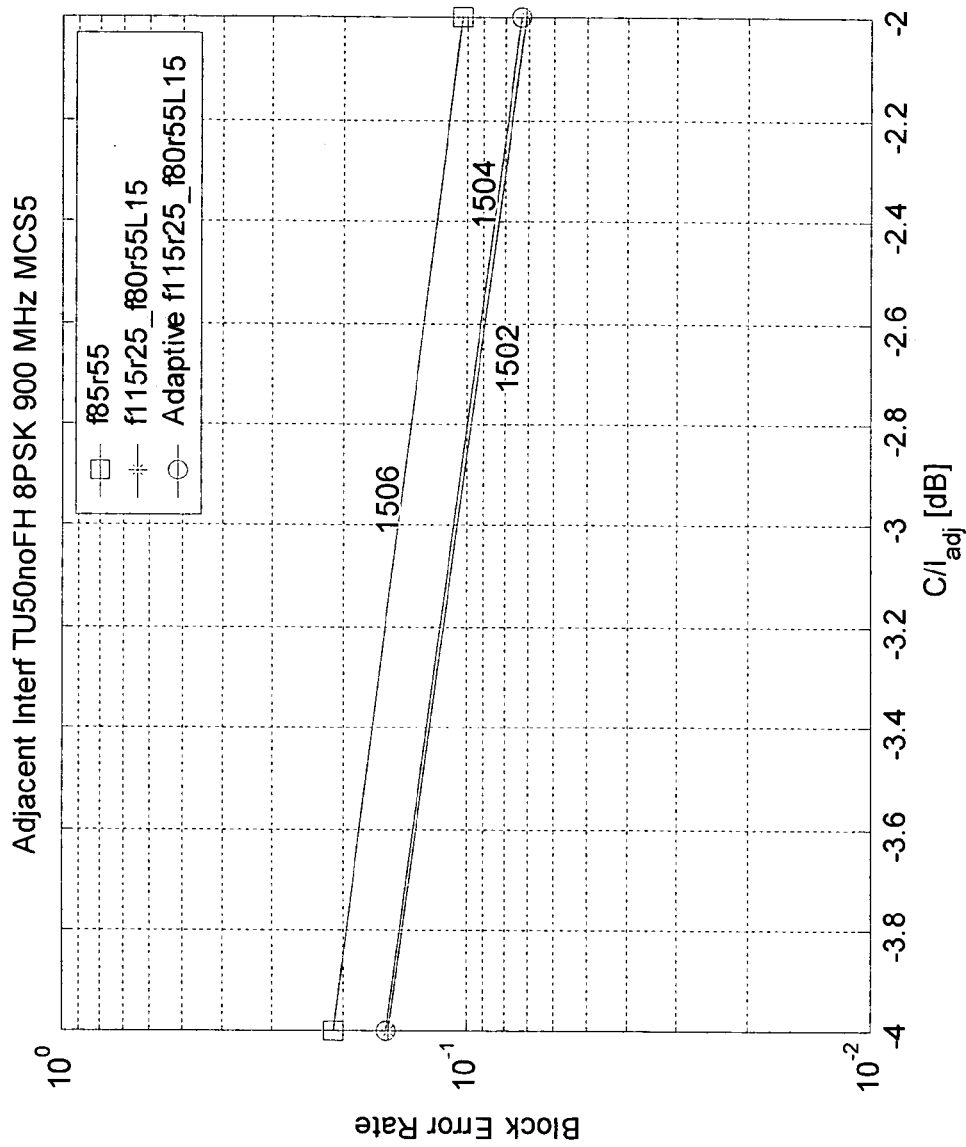
FIG. 15 graphically compares an adjacent channel interference performance measure of a single stage filters to that of an adaptive multi-stage filter.

FIG. 15 illustrates adjacent channel performance when operating in MCS 5 mode. Curve 1502 employs both a first-stage filter with a 115 kHz bandwidth and a roll-off of 0.25 and a second-stage filter with an 80 kHz bandwidth and roll-off of 0.55. The cascaded filter has narrow bandwidth, so it shows good performance in the condition where the adjacent channel interference is a dominant factor. Curve 1504 employs adaptive multi-stage filter. The first-stage filter is a 115 kHz bandwidth and a roll-off of 0.25 and second-stage filter is an 80 kHz bandwidth and roll-off of 0.55. The usage of the second stage filter or not depends the adaptive filter selection of module 912. The prior art solution represented by curve 1506 employs a single stage filter with a frequency bandwidth of 85 kHz and a roll-off of 0.55. These curves clearly show that adaptive multi-stage filter has almost identical performance as the cascaded narrow filter and is better than prior art solution. The adjacent interference detection module can reliably detect the adjacent channel interference presence or not and can adaptively select the filters.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal I has a greater magnitude than signal 2, a favorable comparison may be achieved when the magnitude of signal 1 is greater than that of signal 2 or when the magnitude of signal 2 is less than that of signal 1.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A multi stage filter to implement an adaptive filtering algorithm that services enhanced data rate modulation format signals in a cellular wireless communications system, the multi stage filter comprising:
    a first stage filter having a first bandwidth, wherein the first stage filter receives and filters an input signal to produce a first stage output signal;
    a second stage filter operably coupled to the first stage filter, wherein the second stage filter has a second bandwidth, wherein the second bandwidth is narrower than the first bandwidth, and wherein the second stage filter receives and filters the first stage output signal to produce a second stage output signal; and
    a processing module operable to:
        determine a first stage performance measurement associated with the first stage output signal;
        determine a multi stage performance measurement associated with the second stage output signal;
        compare the first stage performance measurement and the multi stage performance measurement; and
        select a first mode of operation wherein the first stage output signal is selected as a multi stage filter output when the first stage performance measurement compares favorably with the second stage performance measurement; or
        select a second mode of operation wherein the second stage output signal is selected as the multi stage filter output when the first stage performance measurement compares unfavorably with the multi stage performance measurement.

2. The multi stage filter of claim 1, wherein the first stage filter comprises a wide finite impulse response (FIR) filter implemented in an ASIC.

3. The multi stage filter of claim 1, wherein the second stage filter comprises a narrow finite impulse response (FIR) filter implemented by a digital signal processor (DSP).

4. The multi stage filter of claim 1, wherein the second stage filter removes adjacent channel interference.

5. The multi stage filter of claim 1, wherein the processing module is further operable to detect adjacent channel interference.

6. The multi stage filter of claim 5, wherein the processing module:
    selects the second mode of operation upon detecting adjacent channel interference; and
    selects the first mode of operation upon failing to detect adjacent channel interference.

7. The multi stage filter of claim 5, wherein the processing module detects adjacent channel interference based on a difference between the first stage performance measurement and the multi stage performance measurement, and wherein the first stage performance measurement and the multi stage performance measurements comprise signal to noise ratio (SNR) values.

8. The multi-stage filter of claim 7, wherein a large non-zero difference between the first stage performance measurement and the multi stage performance measurement indicates the presence of adjacent channel interference.

9. The multi stage filter of claim 1, wherein the first stage filter comprises a root raised cosine (RRC) filter having a bandwidth greater than 85 kHz, and wherein the second stage filter comprises a RRC filter having a bandwidth less than 85 kHz.

10. The multi stage filter of claim 1, wherein the multi stage filter is within a wireless terminal that operates according to the GSM standard.

11. The multi stage filter of claim 1, wherein the multi stage filter is within a wireless terminal that conducts Enhanced Data rates for GSM Evolution (EDGE) operations.

12. A method to adaptively filter RF communications that provide enhanced data rates, comprising:
    filtering an input signal with a first stage filter having a first bandwidth to produce a first stage output signal;
    filtering the first stage output signal with a second stage filter having a second bandwidth to produce a multi stage output signal;
    determining a first stage performance measurement associated with the first stage output signal;
    determining a multi stage performance measurement associated with the second stage output signal;
    comparing the first stage performance measurement and the multi stage performance measurement; and
    selecting a first mode of operation that outputs the first stage output signal as a filtered output, when the first stage performance measurement compares favorably with the second stage performance measurement; or
    selecting a second mode of operation that outputs the multi stage output signal as the filtered output, when the second stage performance measurement compares unfavorably with the multi stage performance measurement.

13. The method of claim 12, wherein the first stage filter comprises a wide finite intensity response (FIR) filter implemented in ASIC.

14. The method of claim 12, wherein the second stage filter comprises a narrow finite intensity response (FIR) filter implemented by digital signal processor (DSP).

15. The method of claim 12, further comprising detecting adjacent channel interference.

16. The method of claim 15, further comprising removing adjacent channel interference when present.

17. The method of claim 15, wherein:
    the second mode of operation is selected upon detecting adjacent channel interference;
    the first mode of operation is selected upon failing to detect adjacent channel interference.

18. The method of claim 12, wherein comparing the first stage performance measurement and the multi stage performance measurement further comprises determining an absolute difference between the first stage performance measurement and the multi stage performance measurement, and wherein the first stage performance measurement and the multi stage performance measurements comprise signal to noise ratio (SNR) values.

19. The method of claim 18, wherein a large non-zero difference between the first stage performance measurement and the multi stage performance measurement indicates the presence of adjacent channel interference.

20. The method of claim 12, wherein the first stage filter comprises a root raised cosine (RRC) filter having a bandwidth greater than 85 kHz, and wherein the second stage filter comprises a RRC filter having a bandwidth less than 85 kHz.

21. The method of claim 12, wherein the multi stage filter is within a wireless terminal that operates according to the GSM standard.

22. The method of claim 12, wherein the multi stage filter is within a wireless terminal that conducts Enhanced Data rates for GSM Evolution (EDGE) operations.

23. A wireless terminal that comprises:
   a Radio Frequency (RF) front end;
   a system processor communicatively coupled to the RF front end;
   wherein, the RF front end and the system processor are operable to:
      receive RF bursts transmitted according to a transmission scheme;
      adaptively filter the RF bursts with a multi stage filter that further comprises:
         a first stage filter having a first bandwidth, wherein the first stage filter receives and filters an input signal to produce a first stage output signal;
         a second stage filter operably coupled to the first stage filter, wherein the second stage filter has a second bandwidth, wherein the second bandwidth is more narrow than the first bandwidth, and wherein the second stage filter receives and filters the first stage output signal to produce a second stage output signal;
      determine a first stage performance measurement associated with the first stage output signal;
      determine a multi stage performance measurement associated with the second stage output signal;
      compare the first stage performance measurement and the multi stage performance measurement;
      select a first mode of operation wherein the first stage output signal is selected as a multi stage filter output when the first stage performance measurement compares favorably with the second stage performance measurement; or
      select a second mode of operation wherein the second stage output signal is selected as the multi stage filter output when the first stage performance measurement compares unfavorably with the multi stage performance measurement;
      form a data block from the RF bursts; and
      decode the data block.

24. The wireless terminal of claim 23, wherein the first stage filter comprises a wide finite intensity response (FIR) filter implemented in ASIC.

25. The wireless terminal of claim 23, wherein the second stage filter comprises a narrow finite intensity response (FIR) filter implemented by digital signal processor (DSP).

26. The wireless terminal of claim 23, wherein the second stage filter removes adjacent channel interference.

27. The wireless terminal of claim 23, wherein the RF front end and the system processor are further operable to detect adjacent channel interference.

28. The wireless terminal of claim 27, wherein the RF front end and the system processor are further operable to:
   select the second mode of operation upon detecting adjacent channel interference; and
   select the first mode of operation upon failing to detect adjacent channel interference.

29. The wireless terminal of claim 27, wherein the processing module detects adjacent channel interference based on a difference between the first stage performance measurement and the multi stage performance measurement, and wherein the first stage performance measurement and the multi stage performance measurements comprise signal to noise ratio (SNR) values.

30. The wireless terminal of claim 29, wherein a large non-zero difference between the first stage performance measurement and the multi stage performance measurement indicates the presence of adjacent channel interference.

31. The wireless terminal of claim 23, wherein the first stage filter comprises a root raised cosine (RRC) filter having a bandwidth greater than 85 kHz, and wherein the second stage filter comprises a RRC filter having a bandwidth less than 85 kHz.

32. The wireless terminal of claim 23, wherein the wireless terminal operates according to the GSM standard.

33. The wireless terminal of claim 27, wherein the wireless terminal conducts Enhanced Data rates for GSM Evolution (EDGE) operations.

* * * * *